United States Patent
Wang

[11] Patent Number: 6,064,613
[45] Date of Patent: May 16, 2000

[54] PRE-SENSE AMPLIFIER WITH REDUCED OUTPUT SWING

[75] Inventor: Gyh-Bin Wang, Chung-Li, Taiwan

[73] Assignee: Etron Technology, Inc., Hsin-Chu, Taiwan

[21] Appl. No.: 09/221,964

[22] Filed: Dec. 28, 1998

[51] Int. Cl.[7] .................................................. G11C 7/02
[52] U.S. Cl. .................... 365/207; 365/205; 365/208; 327/54
[58] Field of Search ................................ 365/207, 156, 365/205, 208; 327/54, 55

[56] References Cited

U.S. PATENT DOCUMENTS

| | | | |
|---|---|---|---|
| 4,845,672 | 7/1989 | Watanabe et al. | 365/190 |
| 5,412,607 | 5/1995 | Kusaba | 365/208 |
| 5,546,026 | 8/1996 | Lin et al. | 327/54 |
| 5,654,928 | 8/1997 | Lee et al. | 365/205 |
| 5,663,915 | 9/1997 | Mobley | 365/208 |
| 5,850,359 | 12/1998 | Liu | 365/156 |
| 5,894,233 | 4/1999 | Yoon | 327/55 |

OTHER PUBLICATIONS

Sasaki et al., "A 7–ns 140–mW 1–Mb CMOS SRAM with Current Sense Amplifier", IEEE Journal of Solid–state Circuits, vol. 27, No. 11, Nov. 1992, pp 1511–1517.

Primary Examiner—Richard Elms
Assistant Examiner—Hien Nguyen
Attorney, Agent, or Firm—George O. Saile; Stephen B. Ackerman

[57] ABSTRACT

A fast CMOS sense amplifier for semiconductor memories is disclosed. The memory sense amplifier configuration is comprised of differential pre-sense amplifier stage and a sense amplifier second stage. The pre-sense amplifier stage is composed of two sections with feedback between the sections which reduces the output swing by means of a clamping action, therefore improving output switching recovery time in response to differential input. The feedback between the sections is provided by cross connecting the sub outputs of each section to the gate of a clamping transistor at each section. The reduced recovery time produces reduced delay at the output which speeds up the operation of the sense amplifier. Additionally, the clamping devices have the effect of reducing the average DC current in the pre-sense amplifier.

11 Claims, 4 Drawing Sheets

PRE-SENSE AMPLIFIER WITH REDUCED OUTPUT SWING

FIELD OF THE INVENTION

The invention relates to sense amplifiers for MOS (Metal Oxide Semiconductor) solid state memories, and more particularly to fast sense amplifiers operating at low supply voltages.

BACKGROUND OF THE INVENTION

Today, workstations and computers are demanding faster memory subsystems in an effort to enhance system performance. This requires a fast memory access and fast sense amplifiers. In order to reduce power dissipation and allow greater memory chip densities, recent memory designs have utilized a reduced supply voltage. This has presented a special challenge to sense amplifier designers. One of the outcomes is a greater utilization of current-sense amplifiers versus the more conventional voltage-sense amplifiers. These amplifiers produce a larger voltage gain than voltage-sense amplifiers with the same supply voltage but the concomitant recovery time is also longer.

One article and two US patents are known which deal with the subject of sense amplifiers.

Katsuro Sasaki et al, "A 7 ns, 140 mw, CMOS (Complementary Metal Oxide Semiconductor) SRAM (Static Random Access Memory) with Current Sense Amplifier", IEEE Journal of Solid-state Circuits, vol. 27, No. 11, Nov. 1992, pp. 1511–1517 describes two types of current sense-amplifiers and a voltage-sense amplifier presented for comparison purposes. It proposes a PMOS (P-type MOS) bias type and an NMOS (N-type MOS) bias type current-sense amplifiers both of which offer high gain and operate near the saturation level.

U.S. Pat. No. 5,412,607 (Kusaba) discloses a two stage current-sense amplifier wherein the first stage current-sense amplifier has a high gain and requires no external bias which allows operation with reduced current consumption and thus high integration can be achieved.

U.S. Pat. No. 5,654,928 (Lee et al) discloses a high gain, low power current-sense amplifier wherein the amplifier is composed of two identical legs each leg consisting of a PMOS and an NMOS transistor connected in series. The gates of the PMOS transistors are cross coupled to the drains of the PMOS transistors and the gate of each NMOS transistor is cross coupled to the source of the PMOS transistor in the other leg.

SUMMARY OF THE INVENTION

It is an object of the present invention to provide a fast sense amplifier for semiconductor memories.

Another object of the present invention is to provide a sense amplifier for semiconductor memories which operates with low supply voltage, thus reducing the power consumption of the integrated circuits of the amplifier and the memory system.

These objects have been achieved by providing clamping in a pre-sense amplifier in order to reduce the voltage swing of the output signals in response to differential data line input signals. This reduction in the voltage swing advances the recovery point which leads to shorter output delay. The pre-sense amplifier outputs are connected to a second stage amplifier to achieve the final sense amplifier output.

The present invention is applicable to different kinds of sense amplifier implementations, including different MOS implementations and both, current-sense amplifiers and voltage-sense amplifiers. The preferred embodiment is a PMOS type current-sense amplifier.

DESCRIPTION OF THE PREFERRED EMBODIMENTS

Figure 1:
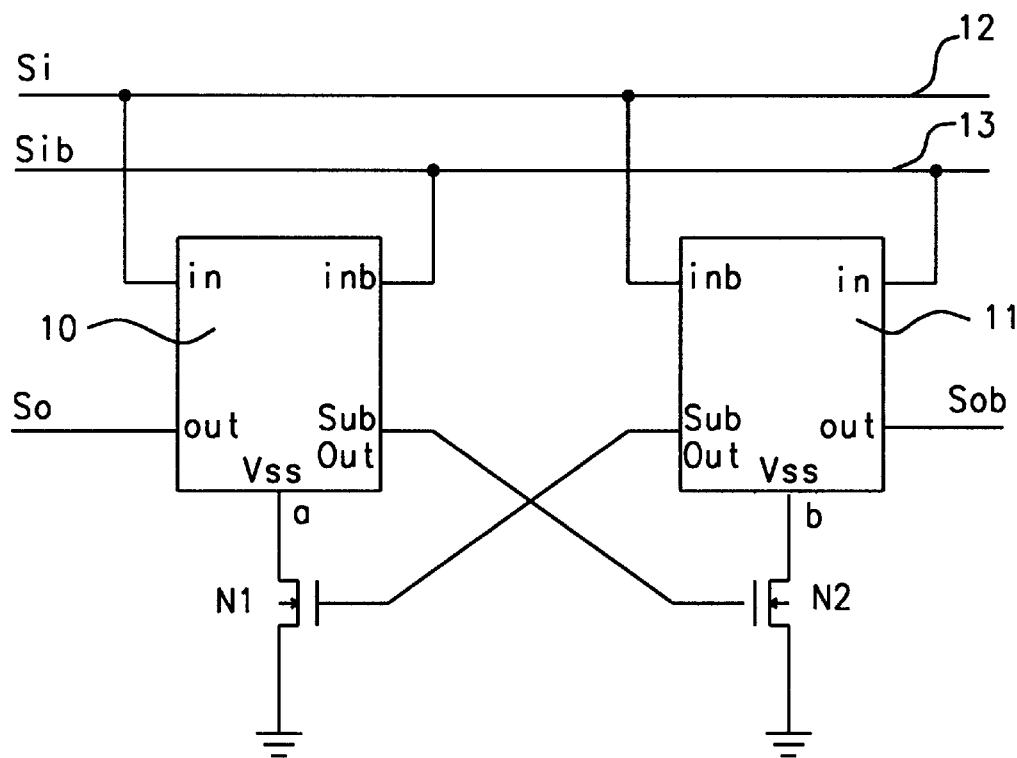
FIG. 1 is a block diagram of a pre-sense amplifier showing the present invention.

FIG. 1 is a high level diagram illustrating the principal components of this invention. The pre-sense amplifier is composed of two identical sections, section 10 and section 11. Each section of the pre-sense amplifier has two input nodes, "in" and "inb" which are connected to the memory data lines 12 and 13. During a memory "read" there is a difference in signal level between si and sib on data lines 12 and 13. This occurs when a connected bit cell is selected. Each pre-sense amplifier section is a differential amplifier, that is when input node "in" is more positive than input node "inb" the output node "out" goes positive and when the input signal levels are reversed, the output node "out" goes negative. There are two outputs in each section of the pre-sense amplifier, "out" and "sub out" which are complementary to each other. As shown in FIG. 1, the data lines 12 and 13 signals "si" and "sib" are connected to the pre-sense amplifier inputs in a reverse manner, that is the input "si" is connected to pre-sense amplifier section 10 "in" node and to pre-sense amplifier section 11 "inb" node and the input "sib" is connected to pre-sense amplifier section 10 "inb" node and the pre-sense amplifier section 11 "in" node. Therefore the outputs "so" and "sob" are complementary. Outputs "so" and "sob" represent the inputs to the next stage differential amplifier.

Each pre-sense amplifier section has a "vss" node to which an NMOS clamping transistor is connected. Transistor N1 controls the current and clamping level in pre-sense amplifier section 10 and transistor N2 controls the current and clamping voltage in pre-sense amplifier section 11. The gate of transistor N1 is connected to the "sub out" node of pre-sense amplifier section 11 and gate of transistor N2 is connected to the "sub out" node of pre-sense amplifier section 10. This circuit arrangement acts as a feedback which by means of clamping action results in limiting pre-sense amplifier output voltage swing. This clamping action results in a faster recovery time and therefore reduced output delay. Additionally, the clamping action of transistor N1 and transistor N2 reduces the average DC bias current in the pre-sense amplifier.

Figure 2:
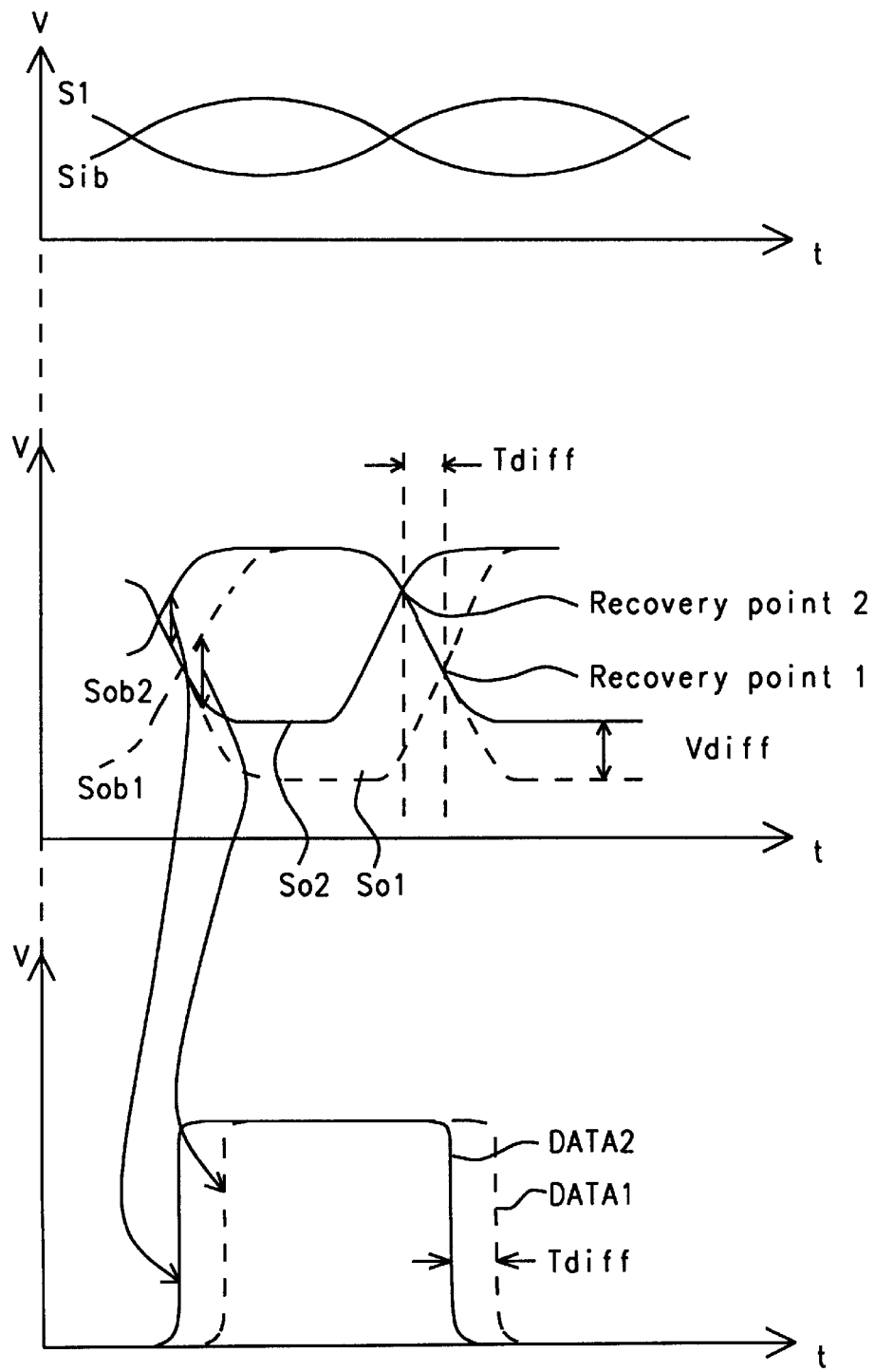
FIG. 2 shows the data line input to the pre-sense amplifier, the pre-sense amplifier output wave forms before and after the present invention, and the output of the sense amplifier before and after the present invention.
Figure 3:
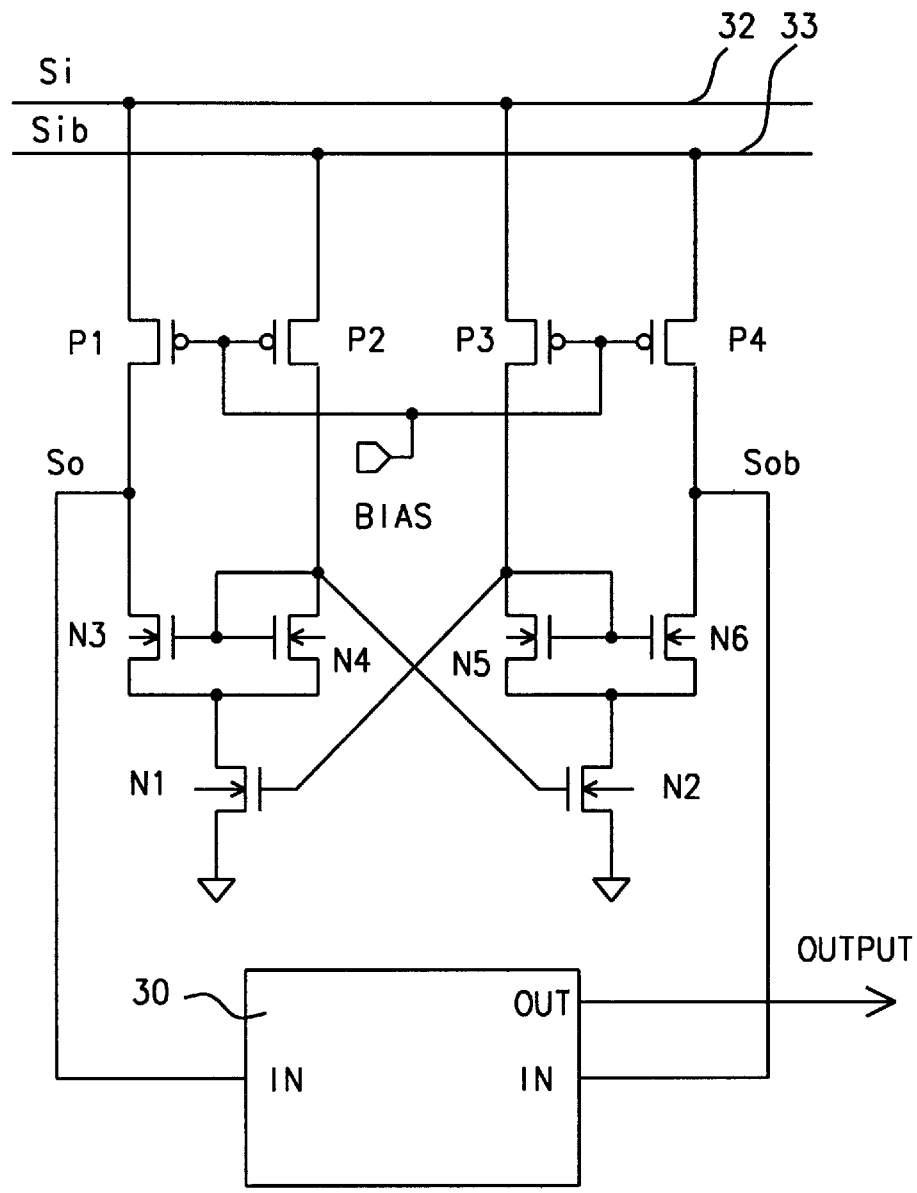
FIG. 3 is the detailed schematic diagram of the preferred embodiment of this invention in a current-sense amplifier.

FIG. 2 shows the input and output wave forms of the pre-sense amplifier with and without clamping. Also shown are the outputs of the second stage, 30, of the sense amplifier as shown in FIG. 3 with and without clamping. The signals si and sib are the inputs to the pre-sense amplifier. Wave forms so and sob are the complementary outputs of the differential pre-sense amplifier of FIG. 1. Wave forms so 1 and sob 1 in FIG. 2 show the pre-sense amplifier output without the addition of the clamping transistors. Wave forms so 2 and sob 2 show the pre-sense amplifier output resulting from the use of the clamping transistors of this invention. As shown in FIG. 2, the effect of clamping reduces the maximum output voltage swing of the pre-sense amplifier. The difference in the said output voltage swing is represented by Vdiff. The reversal of the differential output voltage polarity is noted as the recovery point in FIG. 2. As shown, the effect of clamping produces an earlier Recovery Point 2. Recovery Point 1 occurs without clamping. The improvement resulting from clamping is represented by Tdiff. The reversal in voltage at the recovery point provides an earlier differential signal switch to the inputs of the second stage of the sense amplifier and therefore results in an earlier transition of the data output of the sense amplifier. The output of the sense amplifier without clamping is shown as Data 1. The output with clamping is shown as Data 2. The improvement in delay of the output of the sense amplifier is Tdiff.

FIG. 3 illustrates the circuit schematic of the preferred embodiment. The circuit shown is a P bias type current-sense amplifier used in this invention as a pre-sense amplifier. The section of the circuit comprised of transistors P1, P2, N3 and N4 corresponds to pre-sense amplifier section 10 of FIG. 1. The section of the circuit comprised of transistors P3, P4, N5 and N6 corresponds to the pre-sense amplifier section 11 of FIG. 1. The labels "P" and "N" refer respectively to PMOS and NMOS type transistors. Data line 32 connects to source of transistors P1 and P3 and data line 33 connects to the source of transistors P2 and P4. The gates of transistors P1, P2, P3 and P4 are connected to an appropriate bias voltage. The drain of transistor P1 is connected to the drain of transistor N3 and to the output "so". The drain of transistor P2 is connected to the drain of transistor N4 and to the gates of N3 and N4. This node corresponds to the sub output of pre-sense amplifier section 10 of FIG. 1 and is connected to the gate of transistor N2. The drain of transistor N1 is connected to the source of transistor N3 and transistor N4. The source of transistor N1 and of transistor N2 are connected to ground. The connections in pre-sense amplifier section 11 are similar to those described for pre-sense amplifier section 10. The drain of transistor P4 is connected to the drain of transistor N6 and to the output "sob". The drain of transistor P3 is connected to the drain transistor N5 and to the gates of N5 and N6. This node corresponds to the sub output of pre-sense amplifier section 11 of FIG. 1 and is connected to the gate of transistor N1. The drain of transistor N2 is connected to the source of transistors N5 and N6. The source of transistor N2 is connected to ground. Outputs "so" and "sob" from the pre-sense amplifier are the inputs to the second stage sense amplifier stage 30. The "out" node of the second stage sense amplifier, 30, provides the data output signal. The wave forms of said data output signal are shown in FIG. 2.

Figure 4:
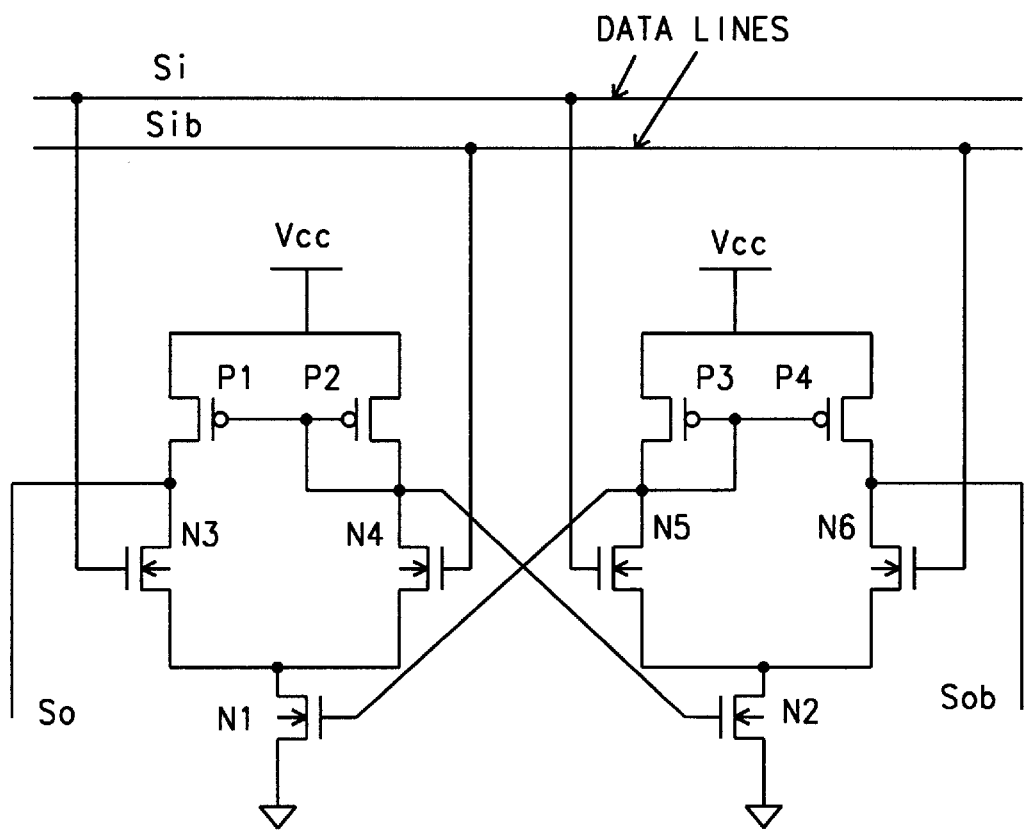
FIG. 4 is a schematic diagram of a voltage-sense amplifier utilizing the present invention.

FIG. 4 shows an alternate embodiment of this invention comprised of a voltage-sense amplifier using the same feedback means as described in the current-sense amplifier of the preferred embodiment. It illustrates that this invention is also applicable to voltage-sense amplifier implementations.

The advantages of the present invention are:

Reduced pre-sense amplifier recovery time resulting in improvement of memory access time Reliable operation with low memory supply voltage Reduced average DC (direct current) current in the amplifier While the invention has been particularly shown and described with reference to the preferred embodiments thereof, it will be understood by those skilled in the art that various changes in form and details may be made without departing from the spirit and scope of the invention.

What is claimed is:

1. A two stage memory sense amplifier where the second stage is an output buffer amplifier and where the first stage is a semiconductor memory pre-sense amplifier having a pair of differential inputs and a pair of complementary outputs and where the memory pre-sense amplifier consists of two sections, each section having a pair of differential input nodes and a pair of complementary output nodes which provide feedback between said sections so as to result in an output response with reduced delay comprising:

a first and second memory data line connected respectively to a first and second input of a first pre-sense amplifier section;

a first and second memory data line connected respectively to a second and first input of a second pre-sense amplifier section;

a first output node and a complementary second output node on said first pre-sense amplifier section where said first output node is a first output of said memory pre-sense amplifier;

a first output node and a complementary second output node on said second pre-sense amplifier section where said first output node is a second output of said memory pre-sense amplifier;

a mechanism for feedback implementation on each of said pre-sense amplifier sections;

wherein said mechanism for feedback implementation on said first pre-sense amplifier section is connected to said second output node of said second pre-sense amplifier section;

wherein said mechanism for feedback implementation on said second pre-sense amplifier section is connected to said second output of said first pre-sense amplifier section; and wherein said pre-sense amplifier connections provide a feedback such as to limit the signal excursion on said first and second memory pre-sense amplifier outputs thereby reducing the delay of the output response of said memory pre-sense amplifier to an input signal on the differential inputs of said memory pre-sense amplifier.

2. The semiconductor memory sense amplifier described in claim 1 further comprising:

a second sense amplifier stage with inputs connected to said first and second outputs of said memory pre-sense amplifier.

3. The semiconductor memory pre-sense amplifier of claim 1, wherein said mechanism for feedback implementation of the first and second pre-sense amplifier sections comprises:

a first MOS transistor device on the first pre-sense amplifier section wherein the gate of said first MOS transistor device of the first pre-sense amplifier section is connected to said second output node of said second pre-sense amplifier section; and a second MOS transistor device on the second pre-sense amplifier section wherein the gate of said second MOS transistor device of the second pre-sense amplifier section is connected to said second output node of said first pre-sense amplifier section.

4. The semiconductor memory pre-sense amplifier of claim 3 wherein;

a current-sense amplifier has said mechanism for feedback implementation.

5. The semiconductor memory pre-sense amplifier of claim 3 wherein;

a voltage-sense amplifier has said mechanism for feedback implementation.

6. The semiconductor memory pre-sense amplifier of claim 4 having two current-sense amplifier sections wherein each section receives complementary input signals from a semiconductor memory and provides the pre-sense amplifier section first output node and the pre-sense amplifier section complementary second output node used to provide the feedback between the two sections.

7. The semiconductor memory pre-sense amplifier of claim 4 wherein said first and said second MOS transistor devices provide a clamping function which respectively limits the output signal excursion of each section of said memory pre-sense amplifier.

8. A semiconductor memory pre-sense amplifier comprising:

a first and second memory data line connected to first and second inputs of first and second pre-sense amplifier sections;

a first output node and a complementary second output node on each of said pre-sense amplifier sections;

an output clamping first MOS transistor device of the first pre-sense amplifier section wherein the connection to the gate of said output clamping first MOS transistor device of the first pre-sense amplifier section is connected to the second output node of the second pre-sense amplifier section; and an output clamping second MOS transistor device of the second pre-sense amplifier section wherein the connection to the gate of said output clamping second MOS transistor device of the second pre-sense amplifier section is connected to the second output node of the first pre-sense amplifier section.

9. The semiconductor memory pre-sense amplifier of claim 8 wherein each of said pre-sense amplifier sections is a current-sense amplifier comprising;

an output clamping first MOS transistor device in said first pre-sense amplifier section; and an output clamping second MOS transistor device in said second pre-sense amplifier section.

10. The semiconductor memory pre-sense amplifier of claim 8 wherein each of said pre-sense amplifier sections is a voltage-sense amplifier comprising;

an output clamping first MOS transistor device in said first pre-sense amplifier section; and an output clamping second MOS transistor device in said second pre-sense amplifier section.

11. The semiconductor memory pre-sense amplifier of claim 8 wherein the said output clamping MOS transistor devices reduce the average DC current in each of said pre-sense amplifier sections.

* * * * *